US009029835B2

(12) United States Patent
Chu-King et al.

(10) Patent No.: US 9,029,835 B2
(45) Date of Patent: May 12, 2015

(54) EPITAXIAL FILM ON NANOSCALE STRUCTURE

(71) Applicant: Intel Corporation, Santa Clara, CA (US)

(72) Inventors: Benjamin Chu-King, Hillsboro, OR (US); Van Le, Beaverton, OR (US); Robert Chau, Portland, OR (US); Sansaptak Dasgupta, Hillsboro, OR (US); Gilbert Dewey, Hillsboro, OR (US); Nitika Goel, Austin, TX (US); Jack Kavalieros, Portland, OR (US); Matthew Metz, Portland, OR (US); Niloy Mukherjee, Beaverton, OR (US); Ravi Pillarisetty, Portland, OR (US); Willy Rachmady, Beaverton, OR (US); Marko Radosavljevic, Beaverton, OR (US); Han Wui Then, Portland, OR (US); Nancy Zelick, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/721,759

(22) Filed: Dec. 20, 2012

(65) Prior Publication Data
US 2014/0175379 A1   Jun. 26, 2014

(51) Int. Cl.
  *H01L 29/06* (2006.01)
(52) U.S. Cl.
  CPC ...................................... *H01L 29/06* (2013.01)

(58) Field of Classification Search
  USPC ............................................................ 257/24
  See application file for complete search history.

(56) References Cited

U.S. PATENT DOCUMENTS

| 6,803,631 | B2 | 10/2004 | Dakshina-Murthy et al. |
| 7,348,284 | B2 | 3/2008 | Doyle et al. |
| 7,494,911 | B2 | 2/2009 | Hudait |
| 2005/0130358 | A1 | 6/2005 | Chidambarrao |
| 2009/0085027 | A1 | 4/2009 | Jin et al. |
| 2010/0295024 | A1* | 11/2010 | Pernel et al. ............. 257/24 |
| 2012/0187482 | A1 | 7/2012 | Adam et al. |

OTHER PUBLICATIONS

Patent Cooperation Treaty, Notification of Transmittal of the International Search Report and the Written Opinion of the International Searching Authority mailed Oct. 29, 2013, for international application No. PCT/US2013/048797.
Bohr, Mark, "Intel's Revolutionary 22 nm Transistor Technology", May 2011, 1-28.
Lochtefeld, Anthony, "Defect Reduction for Lattice Mismatched Epitaxy via Aspect Ratio Trapping", Solid State Technology, Aug. 1, 2008, 5 pages.

(Continued)

*Primary Examiner* — Marcos D. Pizzaro
(74) *Attorney, Agent, or Firm* — Trop, Pruner & Hu, P.C.

(57) ABSTRACT

An embodiment of the invention includes an epitaxial layer that directly contacts, for example, a nanowire, fin, or pillar in a manner that allows the layer to relax with two or three degrees of freedom. The epitaxial layer may be included in a channel region of a transistor. The nanowire, fin, or pillar may be removed to provide greater access to the epitaxial layer. Doing so may allow for a "all-around gate" structure where the gate surrounds the top, bottom, and sidewalls of the epitaxial layer. Other embodiments are described herein.

19 Claims, 11 Drawing Sheets

(56) References Cited

OTHER PUBLICATIONS

Raychaudhuri, S., "Calculation of Critical Dimensions for Wurtzite and Cubic Zinc Blende Coaxial Nanowire Heterostructures", Jul./Aug. 2006, 2053-5059, B 24(4), AVS: Science & Technology of Materials, Interfaces, and Processing.

Kavanagh, Karen L., "Misfit Dislocations in Nanowire Heterostructures" Jan. 22, 2010, 1-7, Semicond. Sci. Technol. 25, IOP Publishing.

Xue, Zhongying, "Epitaxial Growth of Fully Relaxed $Si_{0.75}Ge_{0.25}$ on SOI Substrate" 2011, 5021-5024, Applied Surface Science 257.

Rehder, E. M., "Site Relaxation on Silicon-On-Insulator Substrates: An Experimental and Modeling Study", Dec. 15, 2003, 7892-7903, Journal of Applied Physics, vol. 94, No. 12.

Esfandyarpour, Rahim, "Tunneling Field Effect Transistors", Jun. 12, 2012, 6 pages.

* cited by examiner

EPITAXIAL FILM ON NANOSCALE STRUCTURE

BACKGROUND

A variety of electronic and optoelectronic devices can be enabled by developing, for example, high quality III-V semiconductors on elemental silicon (Si) substrates or IV semiconductors on Si substrates. Surface layers capable of achieving the performance advantages of III-V or IV materials may host a variety of high performance electronic devices such as CMOS and quantum well (QW) transistors fabricated from extremely high mobility materials such as, but not limited to, indium antimonide (InSb), indium arsenide (InAs), germanium (Ge), and silicon germanium (SiGe). Optical devices such as lasers, detectors and photovoltaics may also be fabricated from various other direct band gap materials, such as, but not limited to, gallium arsenide (GaAs) and indium gallium arsenide (InGaAs). These devices can be further enhanced by monolithically integrating them with conventional devices of Si since use of a Si substrate has the additional advantage of cost reduction.

The growth of III-V and IV materials upon Si substrates, however, presents many challenges. Crystal defects are generated by lattice mismatch, polar-on-nonpolar mismatch, and thermal mismatch between the III-V semiconductor epitaxial (EPI) layer and the Si semiconductor substrate or the IV semiconductor EPI layer and the Si semiconductor substrate. When the lattice mismatch between the EPI layer and substrate exceeds a few percent, the strain induced by the mismatch becomes too large and defects are generated in the EPI layer by relaxing the EPI film. Once the film thickness is greater than the critical thickness (i.e., film is fully strained below this thickness and partially relaxed above this thickness), the strain is relaxed by creating misfit dislocations at the film and substrate interface as well as in the EPI film. The EPI crystal defects may be in the form of threading dislocations, stacking faults and twins. Many defects, particularly threading dislocations and twins, tend to propagate into the "device layer" where the semiconductor device is fabricated. Generally, the severity of defect generation correlates to the amount of lattice mismatch between the III-V semiconductor and the Si substrate or the IV semiconductor and the Si substrate.

BRIEF DESCRIPTION OF THE DRAWINGS

Features and advantages of embodiments of the present invention will become apparent from the appended claims, the following detailed description of one or more example embodiments, and the corresponding figures, in which:

DETAILED DESCRIPTION

Figure 1A:
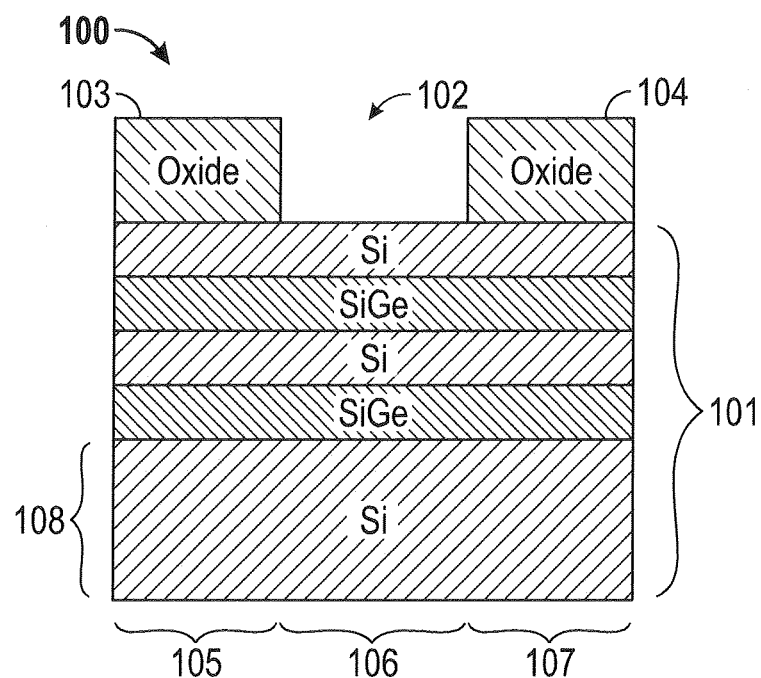
FIGS. 1(a)-(c) depict a nanowire based embodiment of the invention.

In the following description, numerous specific details are set forth but embodiments of the invention may be practiced without these specific details. Well known circuits, structures and techniques have not been shown in detail to avoid obscuring an understanding of this description. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment.

An embodiment includes depositing a material onto a substrate where the material includes a different lattice constant than the substrate (e.g., III-V EPI material on a Si substrate or IV EPI material on a Si substrate). An embodiment of the invention includes an EPI layer that directly contacts, for example, a nanowire, fin, or pillar substrate in a manner that allows the EPI layer to relax with two degrees of freedom (e.g., X and Y) or three degrees of freedom (e.g., X, Y, and Z). The relaxed EPI layer may be included in a channel region of a transistor. The nanowire, fin, or pillar substrate may be removed (fully or partially) to provide greater access to the EPI layer. Doing so may allow for an "all-around gate" where the gate surrounds the top, bottom, and sidewalls of the more exposed EPI layer. Other embodiments are described herein.

An embodiment differs from a conventional technique that involves deposition of thick buffers (that are 0.5 or more microns thick) that bridge the lattice constant difference between the substrate and the layers of interest (device layers including III-V materials and the like). In such conventional techniques complicated anneals and compositional grading processes are used to "bend" the defects into each other within the thick buffer so the defects annihilate. Many thick buffer techniques are time consuming, expensive, include undesirable surface roughness of the buffer, and the minimum defect density still remains high.

Embodiments also differ from a conventional technique that includes Aspect Ratio Trapping (ART). ART is based on threading dislocations that propagate upwards at a specific angle. In ART a trench is made with a high enough aspect ratio such that the defects terminate on the sidewall of the trench and any layer above the terminations is defect free.

In contrast to the above mentioned thick buffer and ART based approaches, an embodiment uses a nanostructure to allow an extra dimension (X and Y directions) or extra dimensions (X, Y, and Z directions) for the EPI film to relax (as opposed to planer EPI films that primarily relax in the Y direction). This nanostructure may be, for example, grown around a nanowire (on the top and/or bottom and/or side wall or walls of the nanowire) and/or grown on top of (or on the bottom of or on a sidewall of or walls of) a fin or pillar (a shorter fin). These nanowire, fin, and pillar based embodiments, among other embodiments, are described below.

Figure 1B:
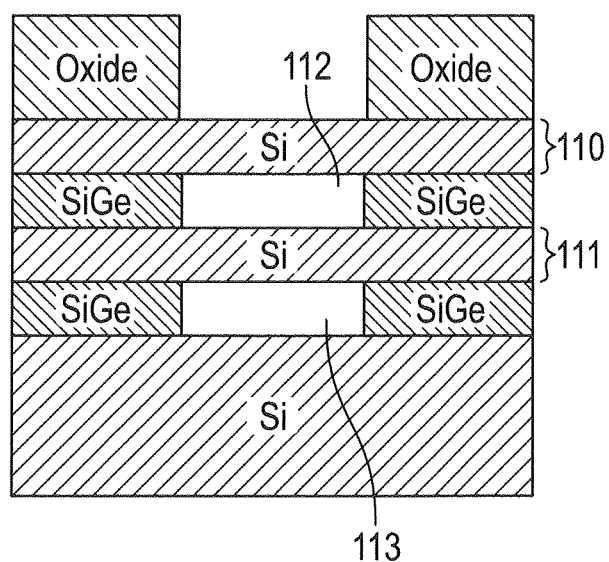
Figure 1C:
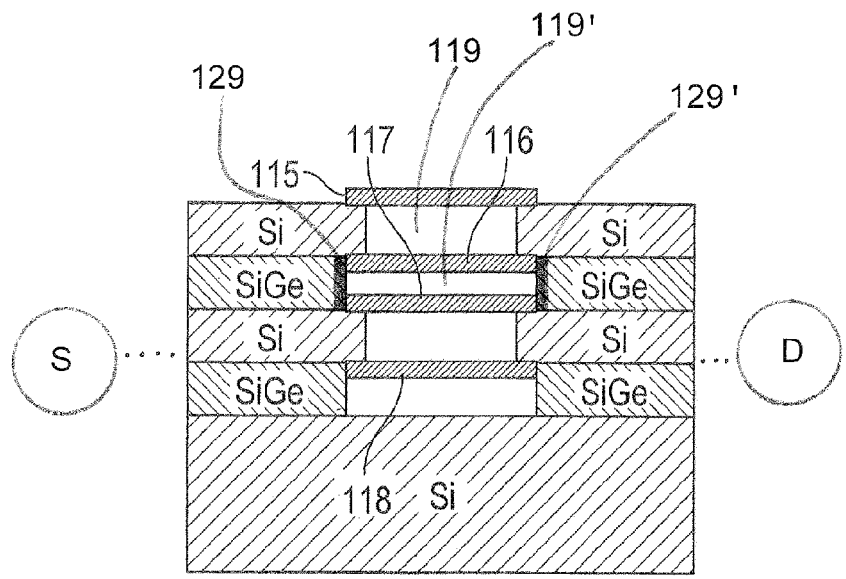
Figure 5:
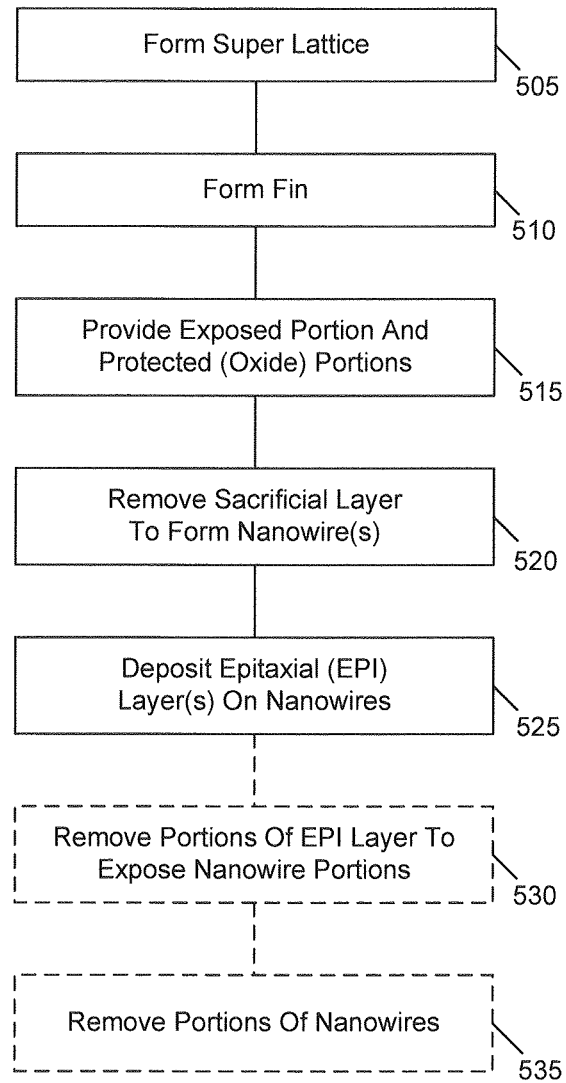
FIG. 5 includes a process in an embodiment of the invention.

FIGS. 1(a)-(c) depict a nanowire based embodiment of the invention. FIG. 5 depicts a method in an embodiment of the invention. FIGS. 1 and 5 are discussed below.

Block 505 includes forming a superlattice with etch selectivity between the layers. For example, device 100 includes alternating Si/SiGe layers but other combinations (e.g., InGaAs/InP) are included in alternative embodiments. Next, the process continues with fin formation (e.g., block 510 and fin 101), wells implant, and the like until a previously formed dummy gate is removed leaving void 102. This exposes area 106, which is adjacent portions 105, 107 (block 515) that are protected by oxide regions 103, 104. In block 520 a sacrificial layer is etched out (e.g., SiGe in FIG. 1(a)), leaving voids 112, 113 and free standing nanowires or nanoribbons 110, 111 that are made of a core material (e.g., Si or SiGe).

In block 525 EPI layers are deposited on the nanowires. The EPI layer(s) can be differing thicknesses such as, for example, 4, 6, 8, 10, 12, or 14 nm. In some embodiments the Si nanowires are left in place and EPI is formed on the top, bottom, and opposing sides of the nanowires (not shown). However, in other embodiments (such as FIG. 1(c)) the EPI on the opposing side walls (or possibly just one wall) of the nanowire(s) is removed (e.g., via wet etch) to provide access to the Si nanowires (block 530). The Si core nanowires may then be removed (e.g., via etch) in block 535 leaving relatively free standing EPI ribbons or wires 115, 116, 117, 118. In one embodiment the voids may remain or may be filled with oxide, insulators, metals and the like. Blocks 530, 535 (shown using dashed lines to indicate the blocks as options for process 500) may be beneficial if the Si core nanowires will degrade electrostatics for the apparatus. In one embodiment, the voids left from removing nanowire portions may be filled or occupied by a high-k/metal gate 119, 119'.

Thus, FIGS. 1(a)-(c) include an apparatus comprising a fin structure from which Si ribbons or wires 110, 111 are formed. EPI layers 115, 116, 117, 118 (having a lattice constant mismatched with the fin lattice constant) are formed directly on the top and sidewall portions of the fin structure. There is no buffer layer between the fin structure and the EPI layer and there is no annealing of the EPI or any ART trenches used to control EPI defects. However, in other embodiments there may be annealing of the EPI and still other embodiments ART trenches may be used to control EPI defects. Furthermore, there may be a buffer 129, 129' in other embodiments. Still, that buffer layer may be very thin (e.g., less than 250, 100, 50, 30, or 15 nm as compared to conventional buffer layers that are more than 0.5 micron in thickness). This may be a critical value to prevent defects that might be included with thicker values. EPI layers 115, 116, 117, 118 may comprise IV and/or III-V materials. For example, EPI layers 115, 116, 117, 118 may include one of Ge, SiGe, GaAs, AlGaAs, InGaAs, InAs, and InSb and the fin structure may include Si (e.g., Si, SiGe), alternating layers of Si and SiGe, InGaAs, InP, and alternating layers of InGaAs and InP. Any of EPI layers 115, 116, 117, 118 may be included in a channel of a transistor and couple to a source (S) and a drain (D) of the transistor (where the source and/or drain may be partially or fully included in fin 101). In an embodiment the critical thickness for the EPI layers is greater than 1, 3, 5, 7, 9, or 11 nm. In an embodiment fin 101 is monolithic with substrate 108 and the EPI layer includes three portions formed directly on the top and sidewall portions of the ribbon and the three portions are monolithic with one another.

Figure 2A:
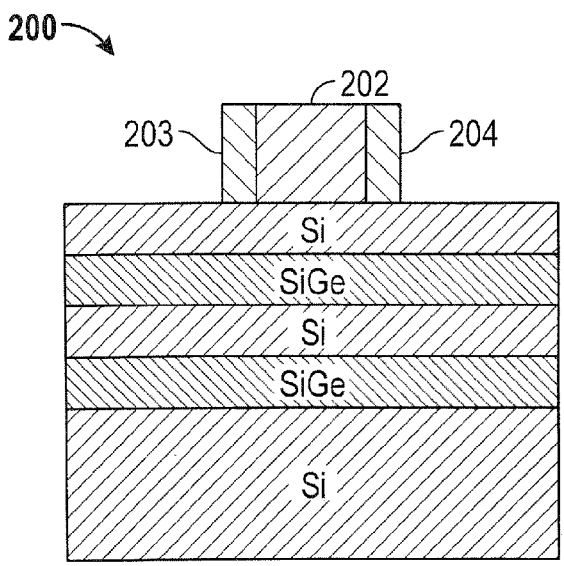
FIGS. 2(a)-(d) depict a nanowire based embodiment of the invention.
Figure 2B:
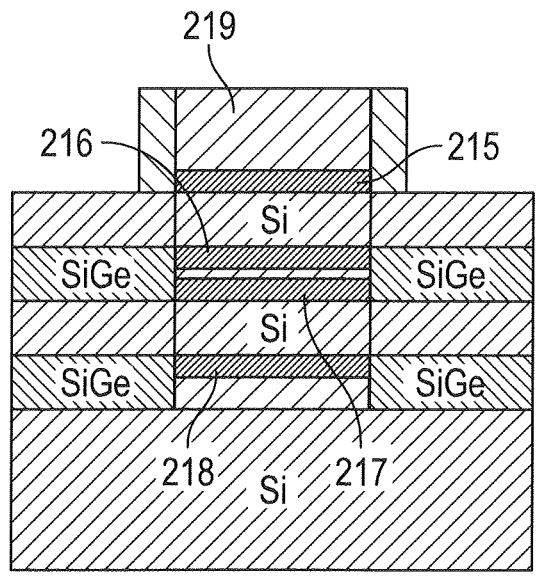

FIGS. 2(a)-(d) depict a nanowire based embodiment of the invention. This concerns an embodiment with a raised source and/or drain. In FIG. 2(a) a superlattice is formed as described above, however apparatus 200 includes dummy gate 202 adjacent oxide spacers 203, 204. FIG. 2(b) shows how the spacers are used to protect portions of sacrificial layers (e.g., SiGe) when other portions of those layers (located between the spacers and under location previously occupied by dummy gate 202) are removed. The spacers also provide for EPI layer depositions 215, 216, 217, 218 in place of the removed sacrificial layer (SiGe) portions located between the spacers. Protective layer 219 (e.g., a second dummy gate that is applied after dummy gate 202 was removed) is located between the spacers after EPI layers 215, 216, 217, 218 are formed. Layer 219 will keep EPI layers used to construct source/drain (see FIG. 2(c) described below) away from the gate region.

Figure 2C:
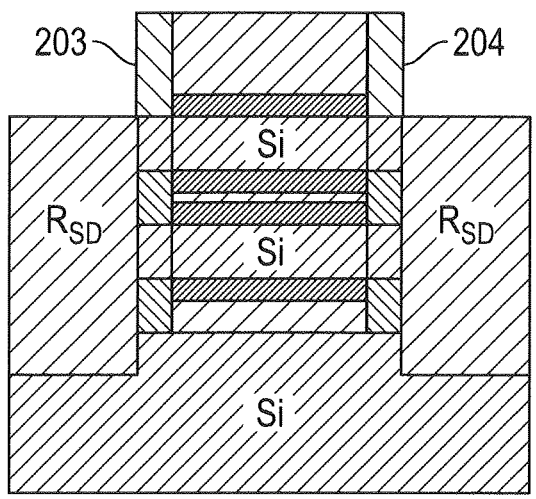
Figure 2D:
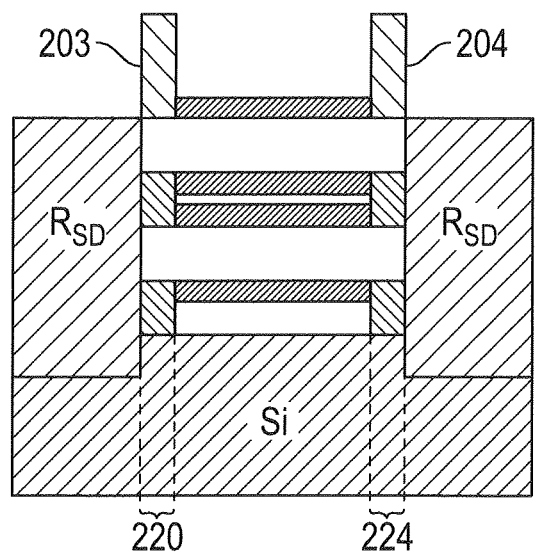

FIG. 2(c) shows how spacers 203, 204 are used to etch out old source/drain regions and deposit new raised EPI source/drains portions ($R_{SD}$). As an option, the spacers may be used to remove nanowire portions (FIG. 2(d)) located between the spacers after layer 219 is removed. As a result portions of former nanowire and/or sacrificial layers (located in regions 220, 224) remain coupled to EPI layers 215, 216, 217, 218. In one embodiment, the voids left from removing nanowire portions may be filled or occupied by a high-k/metal gate, oxide, insulator, and the like.

While FIGS. 2(a)-(d) discuss an embodiment where $R_{SD}$ are formed after EPI ribbons/wires are included in the apparatus, other embodiments may include forming the $R_{SD}$ before EPI ribbons are included in the apparatus. Doing so may still utilize spacers to control lateral $R_{SD}$ growth to preserve Si ribbons that are later accessed via removal of a dummy gate residing above those Si portions. Those Si ribbons or portions may then be used to form EPI ribbons (and the Si ribbons (or any other core ribbon including a material other than Si) may or may not be removed).

Figure 6:
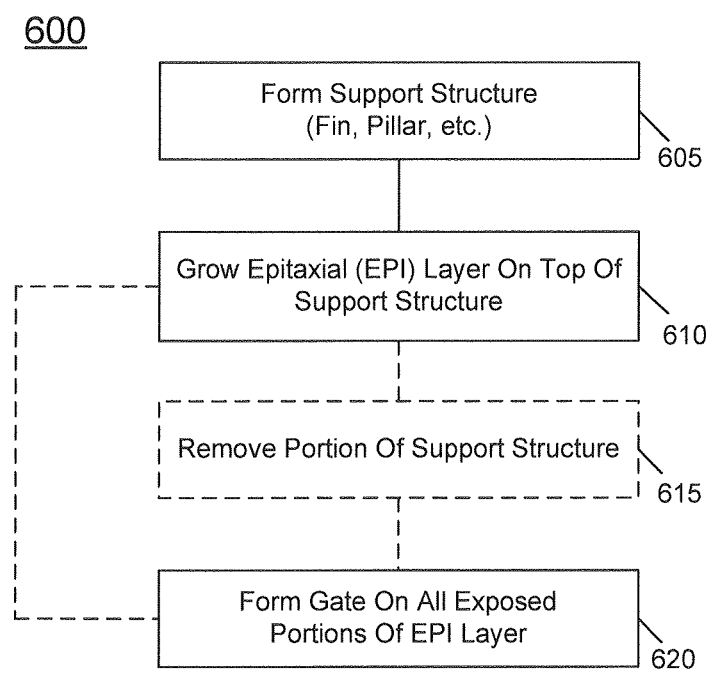
FIG. 6 includes a process in an embodiment of the invention.

FIGS. 3(a)-(d) depict a fin based embodiment of the invention. FIG. 6 depicts a method in an embodiment of the invention. FIGS. 3 and 6 are discussed below.

Figure 3A:
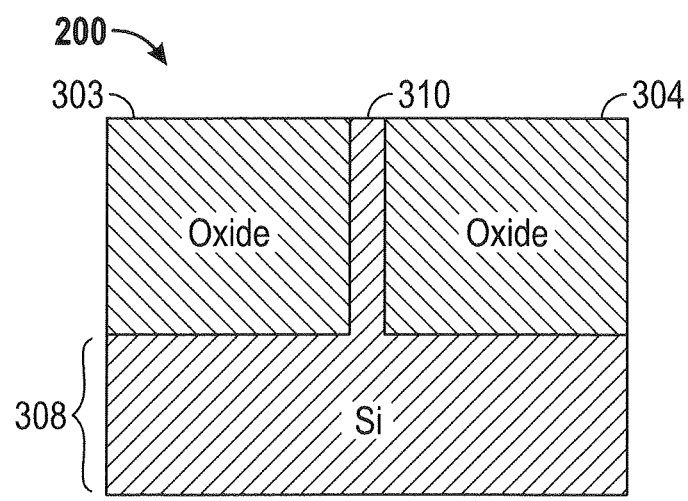
FIGS. 3(a)-(d) depict a fin based embodiment of the invention.
Figure 3B:
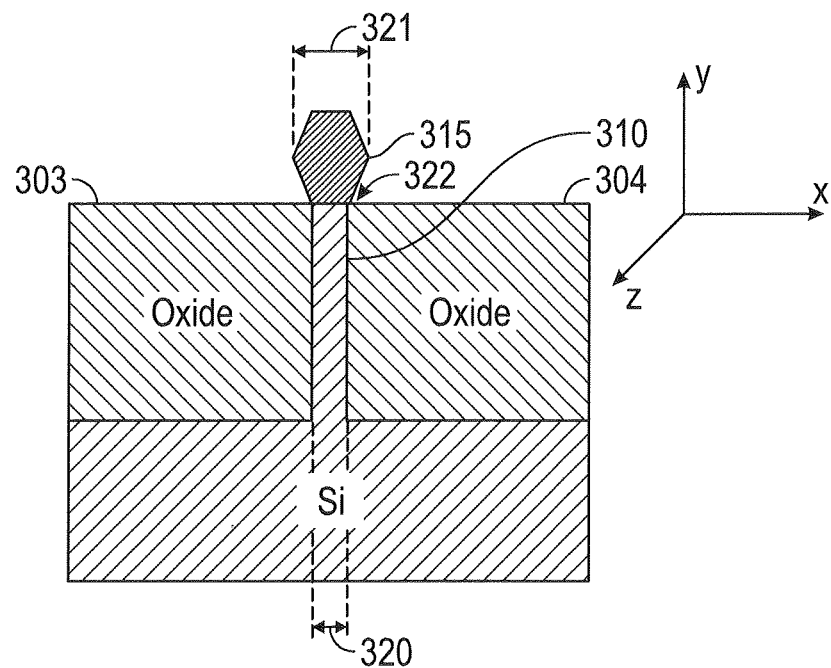

In block 605 a support structure is formed. The support structure may be a fin or a pillar (a shortened fin in an embodiment of the invention). FIG. 3(a) shows fin 310 formed between oxide portions 303, 304. Fin 310 may be monolithic with substrate 308 in an embodiment. The top surface of fin 310 may be modified through the use of, for example, dry or wet chemical pretreatments to foster film growth on facets other than the <100> surface. In block 610 EPI layer 315 is grown on fin 310 (FIG. 3(b)). In an embodiment oxide portions 303, 304 control EPI growth to focus on fin 310. However, in another embodiment a spacer may be used on either side of the fin to control EPI growth.

Figure 4:
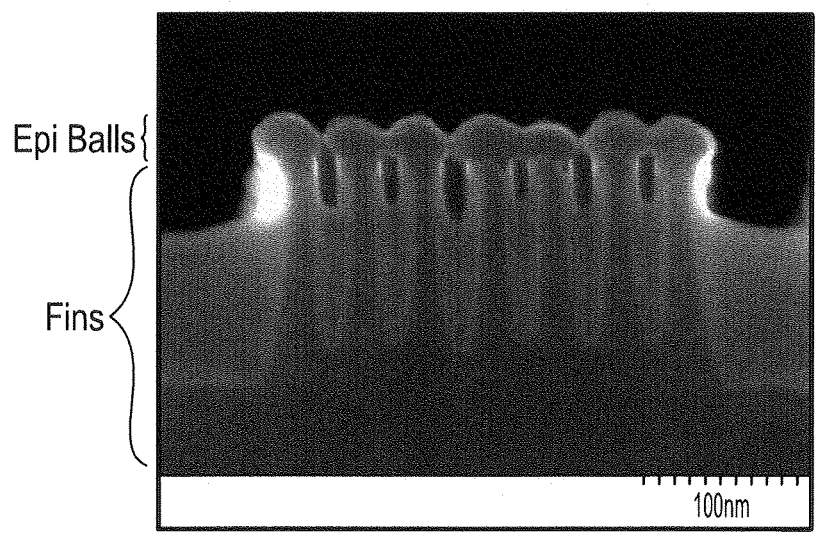
FIG. 4 depicts a fin based embodiment of the invention.

FIG. 4 is based on a scanning electron microscope (SEM) micrograph of 7 EPI "balls" atop 7 fins. The balls may be located in a transistor channel with a source located elsewhere in the fin (e.g., located in the unseen foreground of FIG. 4 along the fin) and a drain located elsewhere in the fin (e.g., located in the unseen background of FIG. 4 along the fin). In an embodiment, spacers may be used to prevent EPI from growing on the sidewall of the fin but in other embodiments such sidewall growth may be encouraged.

Returning to FIG. 3(b), EPI layer 315 is at the fin height seen in conventional multigate fin based transistors in an embodiment of the invention. The shortest distance between the sidewall portions 320 is less than 1, 3, 5, 7, 9, or 11 nm and the EPI layer has a maximum thickness 321 respectively greater than 1, 3, 5, 7, 9, or 11 nm (although the EPI layer has no minimum thickness). The fin and the EPI layer meet at junction point 322 and maximum width 321 of the EPI layer is greater than a width of the fin at the junction point (although in other embodiments the EPI layer is not necessarily wider than the fin at the junction point considering, for example, when the EPI layer is located on top of the fin but not along the fin side walls or, for example, when the fin is extremely narrow). Generally, the higher the fin/EPI lattice mismatch, the smaller the fin width needs to be (to allow for more relaxation of the EPI layer). EPI layer 315 has a general absence of defects along its outer perimeter that borders the fin structure at point 322 in part due to increased degrees of freedom (X, Y, and/or Z).

Figure 3C:
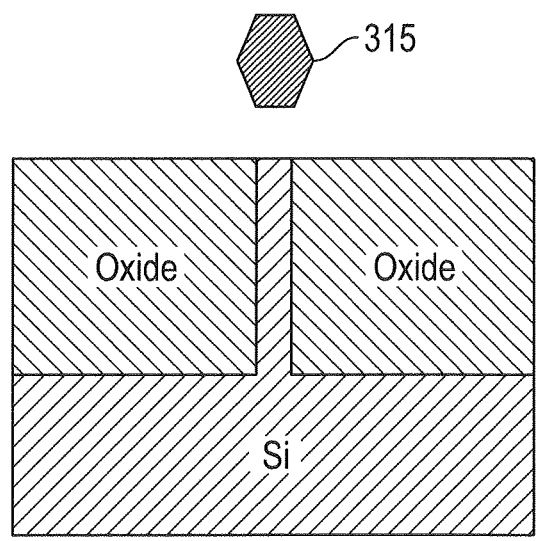

In an embodiment, if the substrate/subfin leakage is unacceptable/undesirable then the pillar/fin can be removed leaving EPI 315 "floating" (FIG. 3(c)) in block 615 (i.e., not immediately surrounded on all sides by supporting material). Analagous material removal was described above regarding the removal of Si potions in FIG. 2(d). The material may be removed after, for example, dummy gate removal. This is optional and other embodiments do not remove this material. Thus, block 615 is shown dashed to show its optional nature.

Block 620 addresses how a gate is formed (directly or indirectly) on some or all exposed portions of EPI 315. If the fin/pillar was removed this allows the gate to be formed as an "all-around gate". In other words, a "tri gate" may provide for a gate that is on top of the EPI as well as along the EPI side walls (e.g., when Fin 310 is not removed). However, the removal of the support structure allows the gate to form under the EPI as well. Doing so may eliminate or at least reduce subfin leakage current.

Figure 3D:
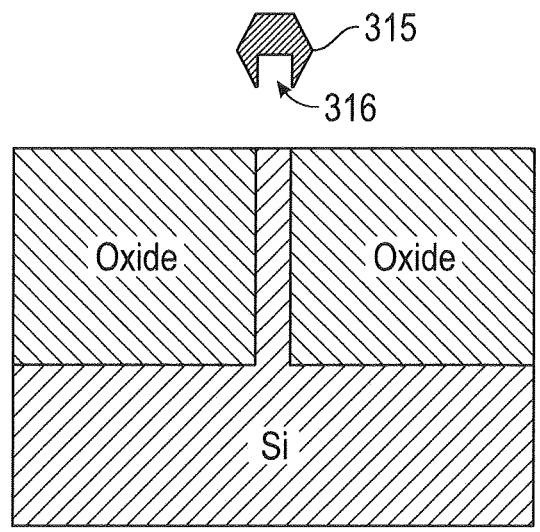

With support structure removal, void 316 may be located within EPI 315 (FIG. 3(d)). This void may be left a void, filled with dielectric, filled with gate material, and the like. Void 316 may retain the shape of the former fin (used to construct EPI 315) or may otherwise include irregular boundaries or smooth boundaries left after support structure removal. In other words, deformation 316 may not be a square with 90 degree angles but instead leave an EPI layer that is asymmetrical.

Figure 7A:
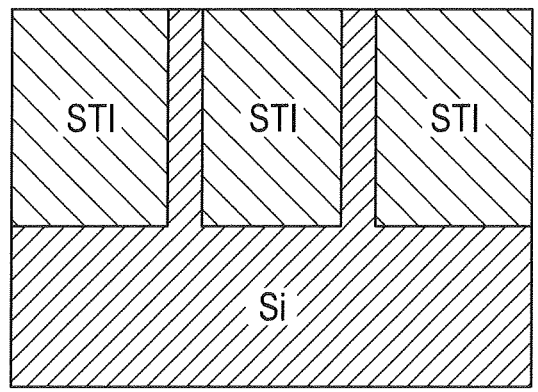
FIGS. 7(a)-(f) include a CMOS process in an embodiment of the invention.
Figure 7B:
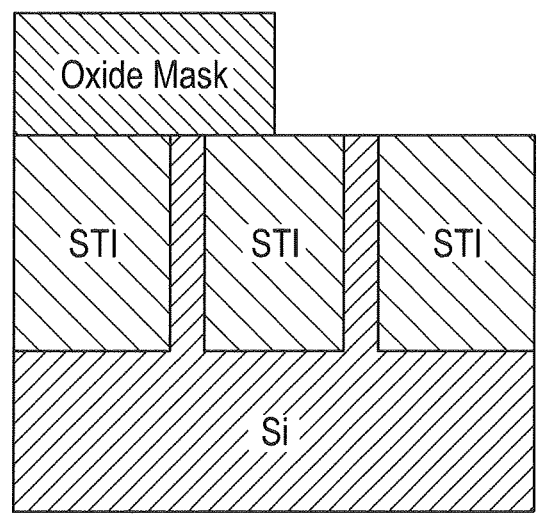
Figure 7C:
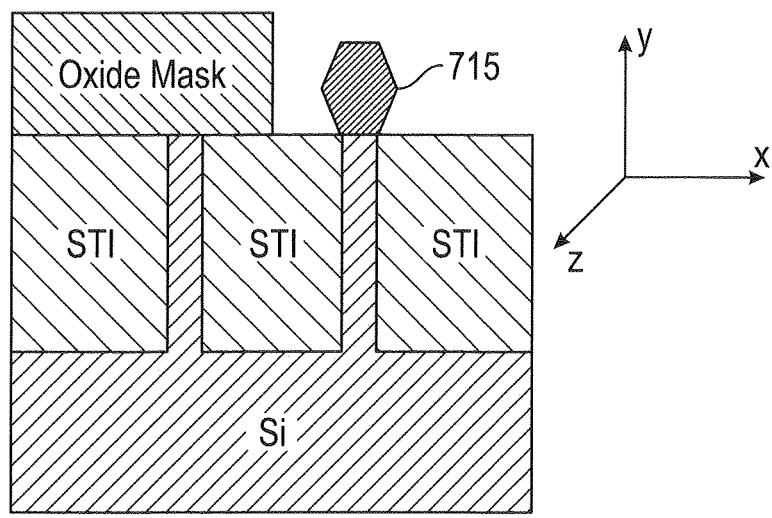
Figure 7D:
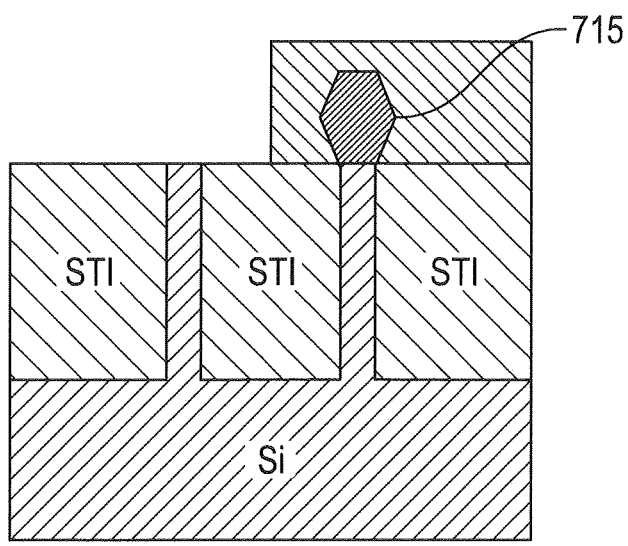
Figure 7E:
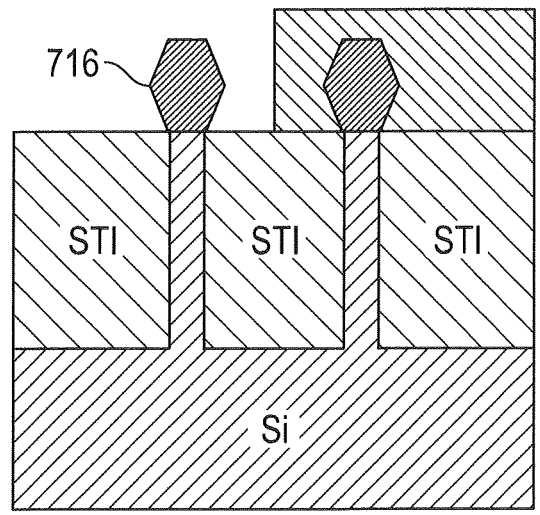
Figure 7F:
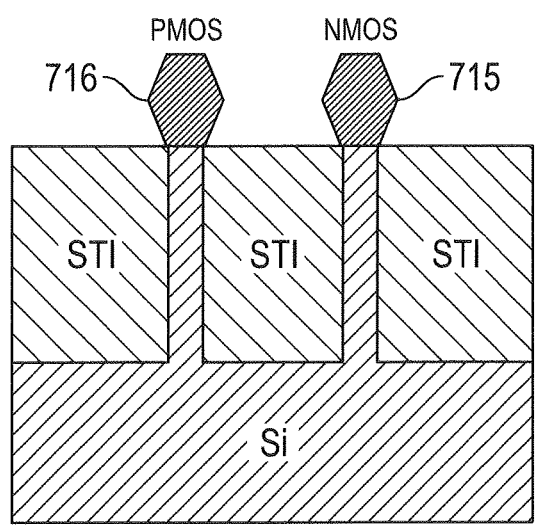

FIGS. 7(a)-(f) include a process for forming CMOS devices with EPI that includes multiple degrees of freedom (e.g., along the X, Y, and Z planes). FIGS. 7(a)-(f) concern a pillar or fin but for nanowire embodiments (e.g., in FIGS. 1(a)-(c)) the same concept is applicable: where there is an EPI deposition step an oxide hardmask is deposited and used to determine which polarity EPI is deposited. FIG. 7(a) includes fin formation; FIG. 7(b) shows a mask in place; FIG. 7(c) shows EPI 715 grown atop one fin (with multiple degrees of freedom along the X, Y, and Z planes); FIG. 7(d) shows the mask changing locations to protect EPI 715 so that in FIG. 7(e) EPI 716 is formed atop another fin. FIG. 7(f) shows the different polarities for EPI 715, 716.

Thus, as shown above embodiments allow an extra degree or degrees of freedom for the EPI layer to relax. For example, with a conventional planar EPI configuration the relaxation is largely limited to the vertical direction (and restrained in the X and Z directions). However, the nanowire embodiments as well as the EPI on pillar/fin embodiments allow for relaxation not only in the Y or vertical but also in the X or horizontal dimension (which runs parallel to the long axis of the fin or wire). Also, depending on the length of the wire or fin (e.g., a very short fin or wire amounts to a pillar) relaxation in the Z is also allowed. Further, the nanowire, pillar, and fin based embodiments have increased critical layer thickness as opposed to planar configurations. In addition, the smaller the wire, fin, or pillar, the larger the benefit to the critical layer thickness (i.e., critical layer thickness increases as the ability to relax in the X and/or Z direction increases). Also, wire, fin, and pillar embodiments allow for a thin EPI layer such as, for example, the same thickness as the channel region in a transistor. Doing so increases throughput and decreases cost of the precursors to growing the material. Further, various wire, fin, and pillar embodiments need no additional process steps beyond the EPI growth. For example, no annealing is necessary (although annealing is used in other embodiments). Also, with the ART approach the creation of the ART trench needs to be done prior to any EPI growth. But with various wire, fin, and pillar embodiments after replacement metal gate (i.e., dummy gate is removed) or after fin/pillar formation, the EPI layers are deposited (without need for ART trenches although other embodiments use ART trenches). Further still, various wire, fin, and pillar embodiments allow for CMOS integration. More specifically, conventional technologies require the distinction between NMOS and PMOS be accomplished through implantation. However, various wire, fin, and pillar embodiments allow for the same masks to be used to mask off the areas for NMOS and PMOS growth, resulting in increased manufacturing efficiency.

In an embodiment an apparatus comprises: a fin structure having a first lattice constant and a top and opposing sidewall portions extending from the top towards a substrate; and an EPI layer, having a second lattice constant different from the first lattice constant, formed on one of the top and sidewall portions. In the case where the fin is very short the fin may be considered a pillar. In an embodiment the EPI layer is formed on the top and sidewall portions. In an embodiment the EPI layer comprises one of a IV and a III-V material and the fin structure includes Si (e.g., SiGe or Si). An embodiment includes an apparatus comprising: a fin structure having a first lattice constant and a top and opposing sidewall portions extending from the top towards a substrate; and an EPI layer, having a second lattice constant different than the first lattice constant, formed on one of the top and sidewall portions; wherein the EPI layer comprises one of a group IV material and a group III-V material and the fin structure includes Si. In an embodiment the EPI layer comprises the group III-V material. In an embodiment the EPI layer is included in a channel of a transistor and couples to a source and a drain of the transistor. The EPI layer, source and drain may all be included in/on the same fin but in other embodiments that is not the case. In an embodiment there is no buffer layer between the fin structure and the EPI layer and the EPI layer directly contacts one of the top and the sidewall portions. In an embodiment the fin structure includes one of silicon and a superlattice structure. In an embodiment there is a buffer layer between the fin structure and the EPI layer, the buffer layer is less than 30 nm thick, and the EPI layer directly contacts the buffer layer. In an embodiment the critical thickness for the EPI layer is greater than 3 nm. In other embodiments the critical thickness is greater than 5, 7, 9, or 11 nm. In an embodiment the fin is monolithic with the substrate and the EPI layer includes three portions directly contacting the top and sidewall portions and the three portions are monolithic with one another. In another embodiment the top may be removed as well as portions of the side walls. In an embodiment the EPI layer has a general absence of defects along its outer perimeter that borders the fin structure (in contrast to other conventional technologies such as ART, which has defects along the EPI/substrate border).

In an embodiment an apparatus comprises first and second columns each including a column portion comprising a lattice constant and one of silicon, a IV material, and a III-V material; and a nanowire including an EPI layer, the EPI layer (a) having an additional lattice constant different from the lattice constant, (b) coupling to each column portion of the first and second columns by one of a direct connection and a buffer layer that is less than 30 nm thick, and (c) comprising one of a IV material and a III-V material. In an embodiment the EPI layer forms an EPI wire of sorts. The support portions of the EPI wire gain support by contacting the support columns The support columns, in one embodiment, may be portions of a fin that were not etched away (as opposed to a fin portion where a sacrificial layer of SiGe or the like was etched away and later replaced with an EPI layer). These support areas then provide support for the EPI layer and even a core wire such as a Si wire stretching between the columns. In an embodiment the EPI layer includes a first EPI support portion, a second EPI support portion, and an EPI middle portion coupling the first and second EPI support portions to one another; the first and second EPI support portions, but not the EPI middle portion, each directly contact the column portions of the first and second columns; and the EPI layer is included in a transistor channel. In an embodiment the first and second columns couple to each other with a coupling portion that includes silicon and the EPI middle portion directly contacts the silicon of the coupling portion. Thus, the coupling portion may constitute part of a Si wire or core wire upon which an EPI wire is located. In an embodiment the nanowire includes an additional EPI layer that includes an additional first EPI support portion, an additional second EPI support portion, and an additional EPI middle portion coupling the additional first and second EPI support portions; wherein the additional first and second EPI support portions couple to the first and second columns and the additional EPI layer does not directly contact the EPI layer. In an embodiment the first and second columns couple to each other with a coupling portion, having opposing faces that each include silicon, and the EPI middle portion and the additional EPI middle portion directly contact the opposing faces. In an embodiment no silicon is located directly between the EPI middle portion and the additional EPI middle portion and the column portions of the first and second columns include one of silicon and silicon germanium. In some embodiments a core material, such as a Si ribbon wire that served as a location for EPI layer growth, may later be removed so no or little Si is between middle portions of adjacent EPI layers. In an embodiment a nanowire may be composed of several EPI layers or EPI wires that do not directly contact one another. In one embodiment a core wire (e.g., Si wire) may include EPI layers on its top and bottom. In an embodiment, such a wire may include an EPI layer on its side wall or EPI layers on its side walls but other embodiments do not include such side wall EPI layers. In an embodiment the EPI middle portion includes a top, bottom, and opposing sidewalls and the apparatus includes a gate surrounding the top, bottom and opposing sidewalls. Thus, an embodiment may include an "all-around gate" formed around an EPI layer that is exposed on its top, bottom, and sides.

In an embodiment an apparatus comprises: a substrate having a first lattice constant; an EPI layer, having a second lattice constant different from the first lattice constant, including a bottom portion and opposing sidewall portions; and a transistor channel including the EPI layer; wherein the bottom portion includes a recess. In an embodiment the recess is collinear with a long axis of a fin included in the apparatus. In an embodiment the bottom portion includes a recess formed by a fin. In an embodiment the recess may exist where a portion of a fin once existed. However, other portions of the fin may remain (e.g., in a source/drain region and/or in a support column) and those portions may align with void or recess.

In an embodiment the EPI layer is unannealed. In an embodiment the EPI layer may, in another embodiment, also be located nonadjacent to any ART trench. In an embodiment the EPI layer is wider than the fin (as judged by the fin's short horizontal axis and not the fin's long horizontal axis). In an embodiment the fin and the EPI layer meet at a junction point and a maximum width of the EPI layer is greater than a width of the fin at the junction point. The EPI layer is wider than the fin's short horizontal axis. In other embodiments the EPI layer is not wider than the fin.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   first and second columns each including a column portion comprising a lattice constant and one of silicon, a IV material, and a III-V material; and
   a nanowire including an epitaxial (EPI) layer, the EPI layer (a) having an additional lattice constant different from the lattice constant, (b) coupling to each column portion of the first and second columns by one of a direct connection and a buffer layer that is less than 30 nm thick, and (c) comprising one of a IV material and a III-V material.

2. The apparatus of claim 1 wherein:
   the EPI layer includes a first EPI support portion, a second EPI support portion, and an EPI middle portion coupling the first and second EPI support portions to one another;
   the first and second EPI support portions, but not the EPI middle portion, each directly contact one of the buffer layer and the column portions of the first and second columns; and
   the EPI layer is included in a transistor channel.

3. The apparatus of claim 2 the nanowire including an additional EPI layer that includes an additional first EPI support portion, an additional second EPI support portion, and an additional EPI middle portion coupling the additional first and second EPI support portions;
   wherein the additional first and second EPI support portions couple to the first and second columns and the additional EPI layer does not directly contact the EPI layer.

4. The apparatus of claim 3 wherein no silicon is located directly between the EPI middle portion and the additional EPI middle portion and the column portions of the first and second columns include one of silicon and silicon germanium.

5. The apparatus of claim 3, wherein the EPI middle portion includes a top, bottom, and opposing sidewalls and the apparatus includes a gate surrounding the top, bottom and opposing sidewalls.

6. An apparatus comprising:
   a fin structure having a first lattice constant and a top and opposing sidewall portions extending from the top towards a substrate; and
   an epitaxial (EPI) layer, having a second lattice constant different than the first lattice constant, on one of the top and sidewall portions;
   wherein the EPI layer comprises one of a group IV material and a group III-V material and the fin structure includes Si.

7. The apparatus of claim 6 wherein the EPI layer is on the top and sidewall portions.

8. The apparatus of claim 6 wherein the fin structure includes one of silicon and a superlattice structure.

9. The apparatus of claim 6 wherein the fin is monolithic with the substrate and the EPI layer includes three portions directly contacting the top and sidewall portions and the three portions are monolithic with one another.

10. The apparatus of claim 6 wherein the EPI layer has a general absence of defects along its outer perimeter that borders the fin structure.

11. The apparatus of claim 6 wherein there is no buffer layer between the fin structure and the EPI layer and the EPI layer directly contacts the Si.

12. The apparatus of claim 6 wherein there is no buffer layer between the fin structure and the EPI layer and the EPI layer directly contacts (a) the Si, and (b) one of the top and the sidewall portions.

13. The apparatus of claim 6 wherein there is a buffer layer between the fin structure and the EPI layer, the buffer layer is less than 30 nm thick, and the EPI layer directly contacts the buffer layer.

14. The apparatus of claim 13 wherein the critical thickness for the EPI layer is greater than 3 nm.

15. The apparatus of claim 6 wherein the EPI layer comprises the group III-V material.

16. The apparatus of claim 15 wherein there is no buffer layer between the fin structure and the EPI layer and the EPI layer directly contacts the Si.

17. The apparatus of claim 15 wherein there is no buffer layer between the fin structure and the EPI layer and the EPI layer directly contacts (a) the Si, and (b) one of the top and the sidewall portions.

18. The apparatus of claim 15 wherein the EPI layer is included in a channel of a transistor and couples to a source and a drain of the transistor.

19. The apparatus of claim 18 wherein there is no buffer layer between the fin structure and the EPI layer and the EPI layer directly contacts one of the top and the sidewall portions.

* * * * *